US007151300B2

(12) United States Patent
Chang

(10) Patent No.: US 7,151,300 B2
(45) Date of Patent: Dec. 19, 2006

(54) PHASE-CHANGE MEMORY DEVICE AND METHOD FOR MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 10/999,357

(22) Filed: Nov. 30, 2004

(65) Prior Publication Data

US 2006/0003515 A1 Jan. 5, 2006

(30) Foreign Application Priority Data

Jun. 30, 2004 (KR) ............... 10-2004-0050068

(51) Int. Cl.
*H01L 21/00* (2006.01)
*H01L 21/20* (2006.01)
(52) U.S. Cl. ............... 257/379; 257/2; 257/4; 257/536
(58) Field of Classification Search .......... 257/2, 257/4, 5, 379, 295, 536
See application file for complete search history.

(56) References Cited

U.S. PATENT DOCUMENTS 5,920,788 A * 7/1999 Reinberg ............... 438/466
7,049,623 B1 * 5/2006 Lowrey ............... 257/3
2003/0209746 A1 * 11/2003 Horii ............... 257/295
2005/0127347 A1 * 6/2005 Choi et al. ............... 257/2

FOREIGN PATENT DOCUMENTS

KR 10-20040022275 3/2004

* cited by examiner

*Primary Examiner*—Michael Trinh
(74) *Attorney, Agent, or Firm*—Ladas & Parry LLP

(57) ABSTRACT

Disclosed are a phase-change memory device and its manufacturing method, which can reduce a contact area between a bottom electrode and a phase-change layer, thereby reducing the quantity of current necessary for phase change. The phase-change memory device comprises: bottom electrodes and top electrodes formed on a dielectric interlayer, each of the bottom electrodes and the top electrodes having both side surfaces in contact with a first oxide layer, a phase-change layer, a nitride layer, and a second oxide layer; the phase-change layer formed between the first oxide layer and the nitride layer while being in contact with the side surfaces of the bottom electrodes and the top electrodes; a third oxide layer formed on the bottom electrodes and the top electrode; and a metal wire in contact with the top electrode.

3 Claims, 4 Drawing Sheets

PHASE-CHANGE MEMORY DEVICE AND METHOD FOR MANUFACTURING THE SAME

BACKGROUND OF THE INVENTION

1. Field of the Invention

The present invention relates to a phase-change memory device and method of manufacturing the same, and more particularly to a phase-change memory device and method of manufacturing the same, which can reduce a contact area between a bottom electrode and a phase-change layer, thereby reducing quantity of current.

2. Description of the Prior Art

Recently, increasing attentions are paid to flash memory devices having a capability of keeping information stored therein even when power supplied thereto is interrupted. Usually, a flash memory includes a tunnel oxide layer, a floating gate, an inter-gate dielectric layer, and a control gate electrode, which are sequentially laminated on a channel. Therefore, in order to improve the reliability and program efficiency of the flash memory devices, it is necessary to improve the film quality of the tunnel oxide layer and increase a coupling rate of each cell.

Further, in place of the flash memory devices, new non-volatile memory devices have recently proposed. For example, a phase-change memory device stores information by using electric resistance difference according to the phase change. In such a phase-change memory device, a thin film made from chalcogenide alloy ($Ge_2Sb_2Te_5$) experiences a phase change from an amorphous state to a crystalline state, so that the resistance and activation energy of the chalcogenide layer decrease while the long-range atomic order and free electron density increase. The phase-change memory device is advantageous in that the phase-change memory device can be easily fabricated as an SOC (System On Chip) and is relatively low priced. Further, the phase-change memory device has a very fast processing speed of 5 ns, consumes a reduced power, and has a wide operation temperature range of −196~180° C.

FIG. 1 is a graph for illustrating a method of programming and erasing a phase-change memory cell.

As shown in FIG. 1, if a phase-change layer is cooled after being heated at a temperature higher than the melting temperature Tm during a first operation time interval T1 (as shown by curve A), the phase-change layer comes into an amorphous state. In contrast, if the phase-change layer is cooled after being heated at a temperature lower than the melting temperature Tm and higher than the crystallization temperature Tc during a second operation time interval T2 longer than the first operation time interval T1 (as shown by curve B), the phase-change layer comes into a crystalline state. Here, the phase-change layer has a higher specific resistance in the amorphous state than in the crystalline state.

Therefore, whether the information stored in the phase-change memory cell refers to a logic '1' or '0' can be determined by detecting the current flowing through the phase-change layer in the 'read' mode. A compound material layer (hereinafter, referred to as "GST layer") consisting of germanium (Ge), stibium (Sb), and tellurium (Te) is widely used as the phase-change layer.

FIG. 2 is a sectional view of a conventional phase-change memory cell.

In the conventional phase-change memory cell as shown in FIG. 2, a dielectric interlayer 5 is formed on a bottom electrode 3 of a semiconductor substrate 1. Then, the dielectric interlayer 5 is etched to form a contact plug 7 electrically connected with source regions and a phase-change layer 9 is then formed on the resultant substrate having the contact plug 7 formed thereon. Thereafter, a top electrode 11 is formed on the phase-change layer 9.

When voltage is applied in order to program the phase-change memory cell, heat is generated at an interface between the phase-change layer 9 and the contact plug 7, so that a portion 9a of the phase-change layer 9 is transformed into an amorphous state. The heat generated at the periphery C of the contact plug 7 and the phase-change layer 9 may be spread to the neighboring contact plug 7 and be unable to reach the temperature necessary for the phase change. Therefore, even after the phase-change layer is phase-changed into an amorphous state, there may remain an abnormal region (which is not changed into the amorphous state) at the periphery of the phase-change layer 9.

Further, in the 'read' and 'write' operations of the phase-change memory device, the large contact area between the bottom electrode and the phase-change layer requires an increased quantity of current for the phase change, thereby having a bad influence on the speed of the phase-change memory device.

SUMMARY OF THE INVENTION

Accordingly, the present invention has been made to solve the above-mentioned problems occurring in the prior art, and an object of the present invention is to provide a phase-change memory device and its manufacturing method, which can reduce a contact area between a bottom electrode and a phase-change layer, thereby reducing the quantity of current necessary for phase change.

In order to accomplish this object, there is provided a phase-change memory device comprising: a semiconductor substrate having a bottom structure; a dielectric interlayer formed on the semiconductor substrate to cover the bottom structure; contact plugs formed within the dielectric interlayer; bottom electrodes formed on the contact plugs, each of the bottom electrodes having both side surfaces in contact with a first oxide layer, a phase-change layer, a nitride layer, and a second oxide layer; top electrodes formed on portions of the dielectric interlayer between the contact plugs, respectively, each of the top electrodes having both side surfaces in contact with the first oxide layer, the phase-change layer, the nitride layer, and the second oxide layer; the phase-change layer formed between the first oxide layer and the nitride layer while being in contact with the side surfaces of the bottom electrodes and the top electrode; a third oxide layer formed on the bottom electrodes and the top electrode and having a contact hole for exposing the top electrode; and a metal wire formed in the contact hole and on the third oxide layer while being in contact with the top electrode.

It is preferred that the phase-change layer has a shape of a bar extending in the long axis direction.

It is also preferred that each of the bottom electrodes and the top electrode is formed of a polysilicon film or a metal film.

In accordance with another aspect of the present invention, there is provided a method of manufacturing a phase-change memory device, comprising the steps of: providing a semiconductor substrate having a bottom structure; forming a dielectric interlayer on the semiconductor substrate to cover the bottom structure; forming a contact plug within the dielectric interlayer; sequentially forming a first oxide layer, a phase-change layer, a nitride layer and a second oxide layer on the dielectric interlayer including the contact plug; patterning the first oxide layer, the phase-change layer, the nitride layer and the second oxide layer to form trenches through which the contact plugs and the dielectric interlayer are exposed; forming a conductive layer on the exposed contact plugs, the dielectric interlayer and the second oxide layer to fill in the trenches; grinding the conductive layer until the second oxide layer is exposed, thereby simultaneously forming both the bottom electrodes contacting the contact plugs and the top electrodes disposed between the bottom electrodes; forming a third oxide layer on a resultant lamination including the second oxide layer, the bottom electrodes, and the top electrode; etching the third oxide layer to form a contact hole for exposing the top electrode; and forming a metal wire on the third oxide layer, the metal wire being in contact with the top electrode.

It is preferred that each of the bottom electrode and the top electrode is formed of a polysilicon film or a metal film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
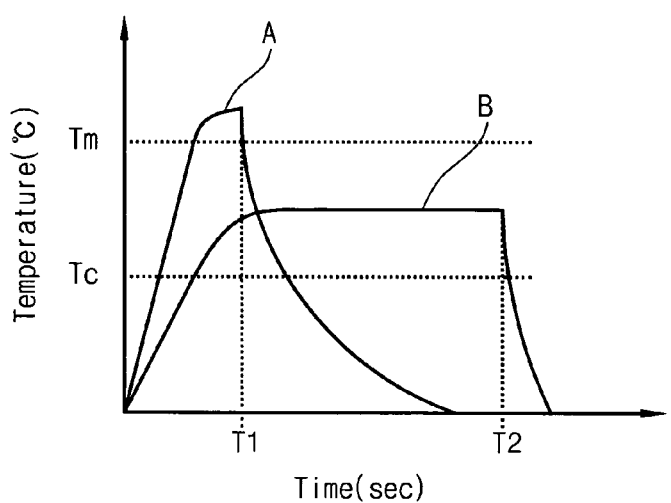
FIG. 1 is a graph for illustrating a method of programming and erasing a phase-change memory cell.
Figure 2:
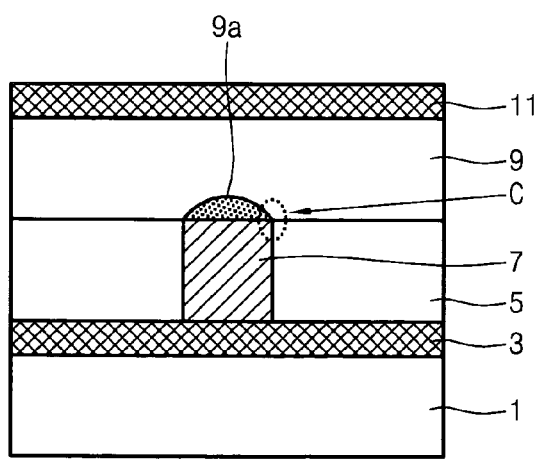
FIG. 2 is a sectional view of a conventional phase-change memory cell.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
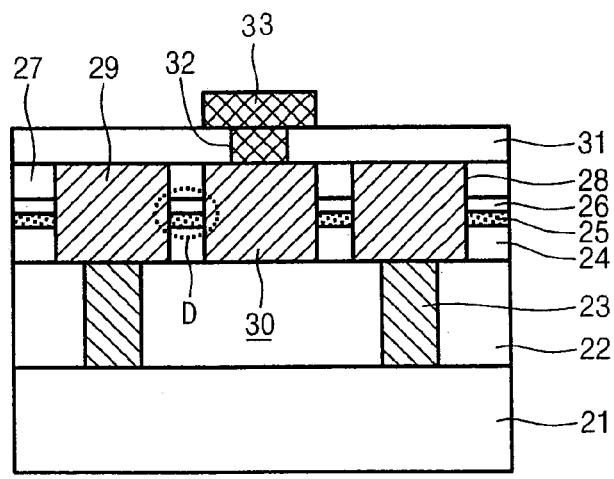
FIG. 3 is a sectional view of a phase-change memory device according to an embodiment of the present invention.

FIG. 3 is a sectional view of a phase-change memory device according to an embodiment of the present invention.

Referring to FIG. 3, in the phase-change memory device according to the present invention, a dielectric interlayer 22 is formed to cover a bottom structure (not shown) of a semiconductor substrate 21 and contact plugs 23 are formed within the dielectric interlayer 22. Also, a bottom electrode 29 is formed on each of the contact plugs 23 in such a manner that both sides surfaces of the bottom electrode 29 are in contact with a first oxide layer 24, a phase-change layer 25, a nitride layer 26 and a second oxide layer 27. A top electrode 30 is formed on each portion of the dielectric interlayer between the contact plugs 23 in such a manner that both sides surfaces of the top electrode 30 are in contact with a first oxide layer 24, a phase-change layer 25, a nitride layer 26 and a second oxide layer 27. The phase-change layer 25 is formed between the first oxide layer 24 and the nitride layer 26 while being in contact with the side surfaces of the bottom electrodes 29 and the top electrode 30. A third oxide layer 31 having a contact hole 32 for exposing the top electrode 30 is formed on the bottom electrodes 29 and the top electrode 30. A metal layer 33 is formed in the contact hole 32 and on the third oxide layer 31 so that the metal layer 33 is in contact with the top electrode 30.

It is preferred that the phase-change layer 25 has a shape of a bar extending in the long axis direction. It is preferred that each of the bottom electrode 29 and the top electrode 30 is formed of a polysilicon film or a metal film.

In a 'read' or 'write' operation of the phase-change memory device, when heat is generated at a contact surface of the phase-change layer 25, the state of the phase-change layer 25 changes into an amorphous state or a crystalline state. In the phase-change memory device according to the present invention, since the phase-change layer 25 is formed between the first oxide film 24 and the nitride film 26 while being in contact with the side surfaces of the bottom electrode 29 and the top electrode 30, the contact area D between the bottom electrode 29 and the phase-change layer 25 can be reduced. As a result, electric current necessary for the phase change can be reduced and the speed of the phase-change memory device can be improved.

FIGS. 4A through 4E are sectional views showing a process of manufacturing a phase-change memory device according to an embodiment of the present invention.

Figure 4A:
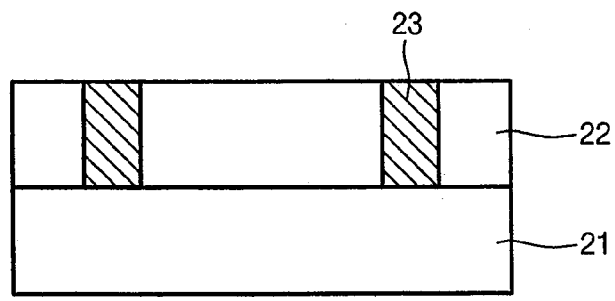
FIGS. 4A through 4E are sectional views showing a process of manufacturing a phase-change memory device according to an embodiment of the present invention.

As shown in FIG. 4A, the dielectric interlayer 22 is formed on the semiconductor substrate 21 having a bottom structure (not shown) to cover the bottom structure. Then, the dielectric interlayer 22 is etched to form the contact plug 23 through the dielectric interlayer 22.

Figure 4B:
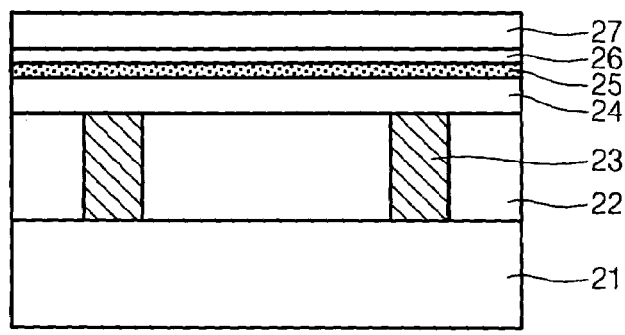

Thereafter, as shown in FIG. 4B, the first oxide layer 24, the phase-change layer 25, the nitride layer 26 and the second oxide layer 27 are formed in sequence on the dielectric interlayer 22 including the contact plug 23.

Figure 4C:
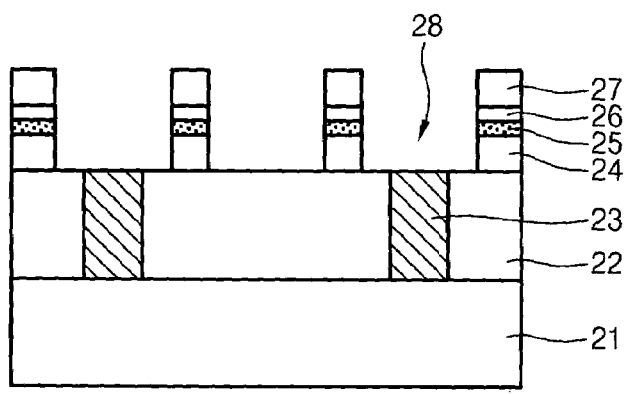

Then, as shown in FIG. 4C, the first oxide layer 24, the phase-change layer 25, the nitride layer 26 and the second oxide layer 27 are patterned to form trenches 28 through which the contact plugs 23 and the dielectric interlayer 22 are exposed. Here, the phase-change layer 25 is formed to have a shape of a bar extending in the long axis direction.

Figure 4D:
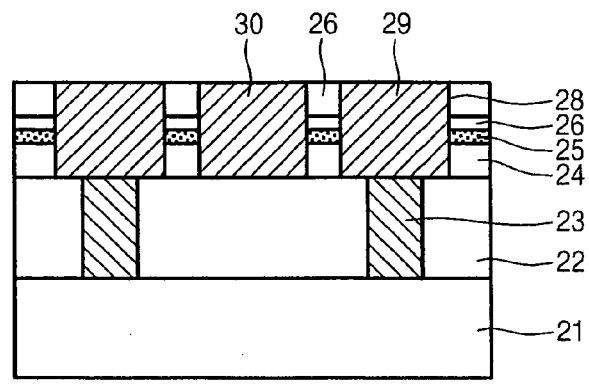

Thereafter, as shown in FIG. 4D, a conductive layer is formed on the exposed contact plugs 23, the dielectric interlayer 22 and the second oxide layer 27 to fill in the trenches 28. Thereafter, the conductive layer is subjected to a CMP process, thereby simultaneously forming both the bottom electrodes contacting the contact plugs 23 and the top electrode 30 disposed between the bottom electrodes 29. Here, the bottom electrodes 29 or the top electrode 30 is formed of a polysilicon film or a metal film.

Figure 4E:
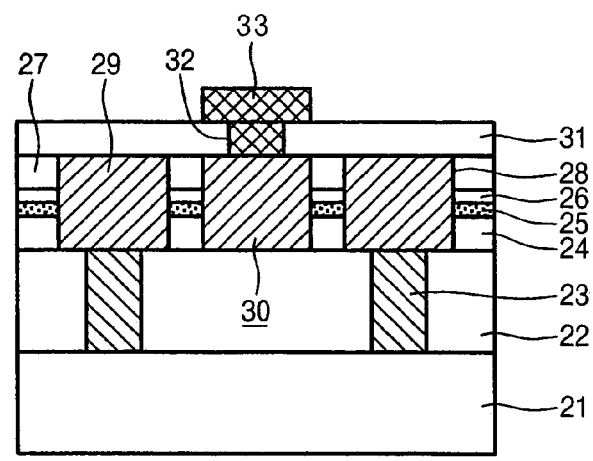

Then, as shown in FIG. 4E, the third oxide layer 31 is formed on the resultant lamination including the second oxide layer 27, the bottom electrodes 29, and the top electrode 30. Then, the third oxide layer 31 is etched to form the contact hole 32 for exposing the top electrode 30. Then, the metal layer 33 is formed on the third oxide layer 29 to fill in the contact hole 32.

Although not shown in the drawings, the metal layer 33 is etched to form a metal wire in contact with the top electrode 25.

As described above, in manufacturing a phase-change memory device, a phase-change layer may be formed to be in contact with the side surfaces of the bottom electrodes and the top electrode, so that the contact area between the bottom electrode and the phase-change layer is reduced.

In a phase-change memory device according to the present invention as described above, in order to facilitate the phase change, a phase-change layer is formed to be in contact with the side surfaces of the bottom electrodes and the top electrode. As a result, the contact area between the bottom electrode and the phase-change layer is reduced, so that electric current necessary for the phase change can be reduced.

Also, such reduction of the electric current necessary for the phase change can consequently improve speed of the phase-change memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change memory device comprising:
   a semiconductor substrate having a bottom structure;
   a dielectric interlayer formed on the semiconductor substrate to cover the bottom structure;
   contact plugs formed within the dielectric interlayer;
   bottom electrodes formed on the contact plugs, each of the bottom electrodes having both side surfaces in contact with a first oxide layer, a phase-change layer, a nitride layer, and a second oxide layer;
   top electrodes formed on portions of the dielectric interlayer between the contact plugs, respectively, each of the top electrodes having both side surfaces in contact with the first oxide layer, the phase-change layer, the nitride layer, and the second oxide layer;
   the phase-change layer formed between the first oxide layer and the nitride layer while being in contact with the side surfaces of the bottom electrodes and the top electrodes;
   a third oxide layer formed on the bottom electrodes and the top electrode and having a contact hole for exposing the top electrode; and
   a metal wire formed in the contact hole and on the third oxide layer while being in contact with the top electrode.

2. The phase-change memory device as claimed in claim 1, wherein the phase-change layer has a shape of a bar extending in the long axis direction.

3. The phase-change memory device as claimed in claim 1, wherein each of the bottom electrodes and the top electrode is formed of a polysilicon film or a metal film.

* * * * *